(12) United States Patent
Teshima et al.

(10) Patent No.: US 8,440,137 B2
(45) Date of Patent: May 14, 2013

(54) AU BONDING WIRE FOR SEMICONDUCTOR DEVICE

(75) Inventors: Satoshi Teshima, Saga-ken (JP); Michitaka Mikami, Saga-ken (JP)

(73) Assignee: Tanaka Denshi Kogyo K.K., Tokyo (JP)

( * ) Notice: Subject to any disclaimer, the term of this patent is extended or adjusted under 35 U.S.C. 154(b) by 701 days.

(21) Appl. No.: 11/791,329

(22) PCT Filed: Nov. 22, 2005

(86) PCT No.: PCT/JP2005/021416
§ 371 (c)(1),
(2), (4) Date: May 23, 2007

(87) PCT Pub. No.: WO2006/057230
PCT Pub. Date: Jun. 1, 2006

(65) Prior Publication Data
US 2007/0298276 A1    Dec. 27, 2007

(30) Foreign Application Priority Data

Nov. 26, 2004 (JP) .................... 2004-343154

(51) Int. Cl.
*C22C 5/02* (2006.01)
*H01L 21/60* (2006.01)

(52) U.S. Cl.
USPC ............ 420/507; 428/606; 174/126.1

(58) Field of Classification Search ............... None
See application file for complete search history.

(56) References Cited

U.S. PATENT DOCUMENTS

| | | | |
|---|---|---|---|
| 4,885,135 A | | 12/1989 | Hosoda et al. |
| 4,938,923 A | * | 7/1990 | Kujiraoka et al. ........... 420/509 |
| 5,702,814 A | * | 12/1997 | Hanada et al. ............... 428/364 |
| 5,945,065 A | * | 8/1999 | Kikuchi et al. .............. 420/507 |
| 6,159,420 A | * | 12/2000 | Akimoto ....................... 420/508 |
| 6,210,637 B1 | * | 4/2001 | Uno et al. ..................... 420/508 |
| 6,213,382 B1 | * | 4/2001 | Akimoto ....................... 228/164 |
| 2005/0079347 A1 | * | 4/2005 | Uno et al. ..................... 428/364 |
| 2008/0050267 A1 | * | 2/2008 | Murai et al. .................. 420/508 |
| 2008/0075626 A1 | * | 3/2008 | Mikami et al. ............... 420/511 |
| 2010/0314156 A1 | * | 12/2010 | Takada et al. ............. 174/126.1 |

FOREIGN PATENT DOCUMENTS

| | | | |
|---|---|---|---|
| EP | 1168439 A2 | * | 1/2002 |
| JP | 63-60105 B2 | | 11/1988 |
| JP | 2-12022 B2 | | 3/1990 |
| JP | 08-088242 | * | 4/1996 |
| JP | 8-325657 A | | 12/1996 |
| JP | 2778093 B2 | | 7/1998 |
| JP | 2814660 B2 | | 10/1998 |
| JP | 10-303235 | * | 11/1998 |
| JP | 2000-040710 | * | 2/2000 |
| JP | 3143755 B2 | | 3/2001 |
| JP | 2002-009101 | * | 1/2002 |
| JP | 2003-7757 A | | 1/2003 |
| JP | 2004-022887 | * | 1/2004 |
| JP | 3535657 B2 | | 7/2004 |

OTHER PUBLICATIONS

Machine translation of JP 05-179376, Jul. 1993.*
Machine translation of JP 08-325657, Dec. 1996.*
Machine translation of JP 09-298213, Nov. 1997.*
Machine translation of JP 2003-007757, Jan. 2003.*
International Search Report of PCT/JP2005/021416, date of mailing Dec. 27, 2005.

* cited by examiner

*Primary Examiner* — John J Zimmerman
(74) *Attorney, Agent, or Firm* — Westerman, Hattori, Daniels & Adrian, LLP

(57) ABSTRACT

An Au bonding wire for semiconductor device, comprising a wire-shaped Au alloy material consisting of: 3-15 mass ppm of Be, 3-40 mass ppm of Ca, 3-20 mass ppm of La, 3-20 mass ppm of at least one functional element selected from the group of Ce, Eu, Mg, and Si, and the remainder of Au, wherein the diameter of said Au alloy bonding wire is less than 23 microns, wherein said bonding wire has improved roundness of compressed bonded ball and improved fracture stress.

7 Claims, No Drawings

AU BONDING WIRE FOR SEMICONDUCTOR DEVICE

This application is based on Japanese Patent Application No. 2004-343154, filed on Nov. 26, 2004, the entire contents of which are incorporated herein by reference.

FIELD OF THE INVENTION

The present invention relates to Au bonding wire for semiconductor device, which is used for connecting outer leads on printed circuit of substrates with electrodes of integrated circuit devices. Moreover particularly, it relates to Au bonding wire, which has superior roundness of squashed ball.

STATE OF THE ART

Conventionally, it is well used that fine wire, which is Au matrix purity of more than 99.99 mass % with partial additive elements has been used for semiconductor devices as bonding wire, which has diameter of 15-30 μm connecting to outer leads with IC chip electrodes.

Usually as a method of connecting Au bonding wire for semiconductor, at the first bonding, it is used mainly ultrasonic thermo-compressed bonding method, heating and melting of the wire tip is carried out with arc heating, forming a ball by surface tension, then the ball is stuck by compressed bonding to electrode of semiconductor, which is heated in the range of 150-300 degrees in Celsius, thereafter the bonding wire is directly wedge bonded to outer lead by ultrasonic combined use heat sticking by pressure. In order to use as transistor or semiconductor equipment, after bonding by bonding wire above-mentioned, for protecting Si chip, bonding wire and lead frame of the part of setting Si chip etc., it is molded by epoxy resin.

Recently it has been required that Au bonding wire should be more fine because of narrower pitch corresponding to multi pins of IC chip under circumstances of semiconductor equipment should be smaller and higher density of itself. Especially the size of semiconductor equipment becomes smaller corresponding to higher integration and smaller, thinner and higher functional of semiconductor equipment. Following on it, size of bonding pad becomes smaller from 100 μm to 40 μm. Decreasing absolute stiffness of wire itself by finer bonding wire, and avoiding short-circuit with neighboring wire by narrower bonding pad distance, higher tensile strength is required for bonding wire. Moreover in the case of narrower bonding pad distance, preventing contact with neighboring squashed ball each other, dispersion of ball diameter should be smaller for bonding wire.

In conventional bonding wire, since there are opposite characteristics between tensile strength and dispersion of ball diameter, it is incompatible for these two characteristics.

Avoiding contact of bonding wire each other, if the strength of bonding wire is strengthened, dispersion of diameter of squashed ball become broader, after all squashed ball is apt to be contacted. On the other hand, decreasing dispersion of diameter of squashed ball, wire flow becomes bigger in molding process. After all bonding wire is apt to be contacted with each other. Higher density package has not been realized because of these opposite characteristics.

For instance, documents on wire bonding hereinbefore are listed below:
(1) JP 2-12022 A
(2) JP 3143755 B
(3) JP H5-179375 A
(4) JP 6-145842 A
(5) JP 7-335686 A
(6) JP 2004-22887 A

DISCLOSURE OF INVENTION

Issues to be Solved by the Present Invention

The present invention provides Au bonding wire for semiconductor device. This Au bonding wire has the following characteristics. Even if diameter of bonding wire becomes less than 23 μm, squashed ball is formed superior roundness, and it has enough tensile strength against wire flow.

Effects of the Present Invention

The inventor had been researched to solve said problem, hence the present invention has been accomplished.

Namely, according to the present invention the following Au bonding wire for semiconductor device is provided.
(1) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and roundness of squashed ball said Au alloy is 0.95-1.05.
(2) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and said Au alloy including 3-20 mass ppm of Ce and/or Eu.
(3) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and said Au alloy including 3-20 mass ppm of at least one element selected from a group of Mg, Si and Ga
(4) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and Au matrix said alloy including 3-80 mass ppm of at least one element selected from a group of Sb, Sn and Bi.
(5) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and said Au alloy including 3-20 mass ppm of at least one element selected from a group of Mg, Si and Ga and said Au alloy including 3-20 mass ppm of Y.
(6) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and said Au alloy including 3-20 mass ppm of at least one element selected from a group of Mg, Si and Ga and an said Au alloy including 3-20 mass ppm of Ce and/or Eu.
(7) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and said Au alloy including 3-80 mass ppm of at least one element selected from a group of Sb, Sn and Bi and said Au alloy including 3-20 mass ppm of Ce and/or Eu.
(8) Au bonding wire for semiconductor device, consisting of Au matrix and functional additives, featured by containing: said Au matrix alloy including 3-15 mass ppm of Be, 3-40 mass ppm of Ca, and 3-20 mass ppm of La and said Au alloy including 3-20 mass ppm of at least one element selected from a group of Mg, Si and Ga and said Au alloy including 3-20 mass ppm of Ce and/or Eu moreover said Au alloy including 3-20 mass ppm of Y.

(9) Au bonding wire for semiconductor device, featured said Au alloy matrix is consisting of more than 99.99 mass % purity of Au.

(10) Au bonding wire for semiconductor device, featured the roundness of squashed ball of said Au alloy is 0.95-1.05 and fracture stress of said Au alloy bonding wire is more than 23 kg/mm$^2$.

(11) Au bonding wire for semiconductor device, featured the diameter of said Au alloy bonding wire is less than 23 μm.

Roundness of squashed ball in the present invention is defined as follows:

After forming a melted ball from fine bonding wire, diameter of squashed ball from the aspect of direction of pressure bonding, is set as Y-axis as same as ultrasonic energy imposed direction from bonding machine, and is set as X-axis to orthogonal direction of Y-axis, maximum value of X-axis of squashed ball and maximum value of Y-axis of squashed ball are defined as value of X-axis ($x_i$) and value of Y-axis ($y_i$). 200 bonds are defined as the first bonding by using ultrasonic bonding machine, each value of X-axis ($x_i$) and each value of Y-axis ($y_i$) are measured. Then making an arbitrary selection of 50 bonds from the 200 bonds, for those 50 bonds, values are calculated from the value of X-axis ($x_i$) divided by the value of Y-axis ($y_i$). Finally, diameter of said squashed ball is defined as the mean of these 50 bonds.

In the present invention fracture stress is defined as the value of tensile strength divided by section area of Au bonding wire under tensile test, and this fine bonding wire has 4% elongation rate conditioned by heat treatment at 400-500 degrees in Celsius after continuous drawing.

Au bonding wire for semiconductor device of the present invention is consisting of Au matrix and functional additives, though the diameter of said bonding wire become less than 23 μm, it keeps absolute stiffness of wire itself and the said bonding wire has effect of roundness of squashed ball. Consequently bonding area is narrow enough at the first bonding, short-circuit with neighboring wire does not occur in such higher density mounting.

DESCRIPTION OF THE MOST PREFERRED EMBODIMENT

On Au bonding wire for semiconductor device of the present invention, the matrix is consisted of Be, Ca, La and Au. Au using for matrix of the present invention has purity of more than 99.99 mass %, more preferably 99.999 mass %. It had been well known that above mentioned matrix has effect of hardening and increasing stiffness of pure Au matrix so far. However diameter of bonding wire becomes thinner from 25 to 23 μm, there are defects of too hardened Au alloy using conventional Au matrix and what is apt to break semiconductor chip.

It had been researched Au matrix which is stable at hardness and stiffness though adding various elements by the inventors, it has been found that total amount of Be, Ca and La is less than 75 mass ppm, more preferably 59 mass ppm is stable at hardness and stiffness. Though either of Be, La and Ca is an element, which is apt to deform shape of melted ball against pure Au, in this Au—Be—Ca—La matrix, Be principally has effect of increasing hardness, either of Be, La and Ca has effect of increasing stiffness, Ca mainly has a role of balancing to whole alloy. To clarify these effect, each purity of Be, Ca and La should be recommended more than 99 mass %, preferably 99.9 mass %.

The Au—Be—Ca—La matrix (Au matrix) according to the present invention, setting prescribed amount of said partial of additive elements (Be, Ca and La), it has been found that roundness of squashed ball is improved. The content to whole mass of Au alloy forming wire has the range of 3-15 mass ppm of Be, 3-40 mass ppm of Ca, 3-20 mass ppm of La, and preferably the range of 7-13 mass ppm of Be, 7-30 mass ppm of Ca, 8-16 mass ppm of La. At less than 3 mass ppm of either of Be, Ca and La, absolute stiffness after forming bonding wire becomes lower, the wire bonded does not endure to flow of resin in molding process. It is so called wire flow. Especially it greatly appears tendency of wire flow when diameter of bonding wire is less than 23 μm. Adding more than 15 mass ppm of Be, wire strength is decreased when conditioning 4% elongation through heat treatment. Adding more than 40 mass ppm of Ca, or more than 20 mass ppm of La, deformation of squashed ball becomes unstable, and dispersion of diameter of squashed ball becomes broader. The total amount of said partial additives in Au matrix should be more than 9 mass ppm, preferably more than 22 mass ppm.

Au—Be—Ca—La—Ce alloy and Au—Be—Ca—La—Eu alloy adding as functional element of Ce or Eu to this Au—Be—Ca—La matrix, either becomes having improved fracture stress and improved roundness of squashed ball, setting amount of appropriate range of partial additives. The amount of content to whole mass of Au alloy is 3-15 mass ppm of Be, 3-40 mass ppm of Ca, and 3-20 mass ppm of La, preferably 7-13 mass ppm of Be, 7-30 mass ppm of Ca, and 8-16 mass ppm of La. In the case of less than 3 mass ppm of either of Be, Ca and La, absolute stiffness of bonding wire becomes lower and it does not endure to wire flow. Especially it remarkably appears tendency of wire flow when diameter of wire is less than 23 μm. Adding more than 15 mass ppm of Be, wire strength is decreased when conditioned 4% elongation by heat treatment. Adding more than 40 mass ppm of Ca, or more than 20 mass ppm of La, deformation of squashed ball becomes unstable, dispersion of diameter of squashed ball become broader.

Purity of functional additives of Ce or Eu is more than 99 mass %, preferably more than 99.9 mass %. The amount of content to whole mass of Au alloy forming wire is 3-20 mass ppm of Ce or Eu, preferably range of 8-16 mass ppm of Ce or Eu. It is found that Ce or Eu is finely dispersed in the matrix of 4 elements alloy of Au—Be—Ca—La, and it has an effect of greatly improving fracture stress. Moreover it is found that effect of improving fracture stress by Ce or Eu is not hardly influenced though adding Si, Mg and Ga, or Sb, Sn and Bi, or Y as functional additive element. However adding less than 3 mass ppm of Ce or Eu, it is not enough to improve fracture stress, and adding more than 20 mass ppm of Ce or Eu, dispersion of diameter of squashed ball becomes broader. Hence content range of Ce or Eu has been determined as hereinbefore.

To this Au—Be—Ca—La matrix, Au—Be—Ca—La—Mg alloy adding Mg, Si or Ga as functional elements, Au—Be—Ca—La—Si alloy or Au—Be—Ca—La—Ga alloy has progressed fracture stress and superior roundness of squashed ball adding partial additives of defined range of content. The amount of content to whole mass of Au alloy forming bonding wire is 3-20 mass ppm of Mg, 3-20 mass ppm of Si, and 3-20 mass ppm of Ga, preferably 7-18 mass ppm of Mg, 7-18 mass ppm of Si, and 7-18 mass ppm of Ga. If the content is less than 3 mass ppm of either of Mg, Si and Ga, it has no effect to improve roundness. Adding more than 20 mass ppm of Mg, and more than 20 mass ppm of Si, or more than 20 mass ppm of Ga, deformation of squashed ball become unstable, dispersion of diameter of squashed ball become broader. Hence content range of Mg, Si or Ga is determined as hereinbefore.

Purity of Mg, Si or Ga is more than 99 mass %, preferably more than 99.9 mass %. It is found that Mg, Si or Ga is finely dispersed in Au—Be—Ca—La matrix, and it has an effect of outstandingly improving roundness of squashed ball. Moreover it is found that effect of improving roundness by Mg, Si or Ga is hard to be influenced adding Ce, Eu or partial additive of Y as functional additive element.

It is found that either of Au—Be—Ca—La—Sn alloy, Au—Be—Ca—La—Sb alloy and Au—Be—Ca—La—Bi alloy added Sn, Sb or Bi as functional additives to Au—Be—Ca—La matrix, setting appropriate range of content, improving fracture stress and improving roundness of squashed ball. The amount of content to whole mass of Au alloy forming wire is 3-80 mass ppm of Sb, 3-80 mass ppm of Sn, and 3-80 mass ppm of Bi, preferably range of 30-60 mass ppm of each element. Adding less than 3 mass ppm or more than 80 mass ppm of each element of Sn, Sb or Bi, effect to tightly form round shape of squashed ball disappears and deformation of squashed ball at bonding becomes unstable, and dispersion of diameter of squashed ball becomes broader.

Purity of Sn, Sb or Bi is more than 99 mass %, preferably 99.9 mass %. It is found that Sn, Sb or Bi is finely dispersed in Au—Be—Ca—La matrix, and it has effect of outstandingly improving roundness of squashed ball. Moreover it is found that effect of improving roundness of squashed ball by Sn, Sb or Bi is hard to be influenced though adding partial additive of Ce or Eu.

By the way total amount of all partial additive elements to Au matrix is less than 100 ppm, preferably range of 20-90 ppm. Because it is possible to display as "purity is more than 99.99 mass % of Au", and it is possible to get stable roundness though thinning wire diameter from 25 μm to 23 μm for its good dispersion in Au matrix. The diameter of bonding wire should be 25 to 5 μm, preferably 23 to 8 μm.

EMBODIMENT OF THE PRESENT INVENTION

Example No. 1—No. 53

99.999 mass % of high purity of Au, compounding with partial additive elements shown values (mass ppm) in Table 1, was melted and cast in vacuum furnace. Drawing this alloy into wire, which diameter is at 25 μm, 22 μm, 20 μm, and 15 μm, and was controlled 4% elongation by final heat-treatment. This fine bonding wire was bonded as the first bonding on the 60 μm square Al pad of semiconductor chip in the Air. All squashed balls were formed within 60 μm square Al pads at the first bonding. The result is shown in Table 2.

The examples, except content composition of partial additives varied shown in Table 3, were obtained as fine bonding wire by the same heat treatment condition. These fine bonding wires were evaluated in same condition as above embodiment. The result is shown in Table 4.

By the way, following method did evaluation of "Fracture stress". 99.999 mass % of high purity of Au, compounding with partial additive elements shown values (mass ppm) in Table 1, it was melted and cast in vacuum furnace. Drawing this alloy into wire, which diameter was at 25 μm, 22 μm, 20 μm and 15 μm, was conditioned 4% elongation by final heat-treatment. Then the bonding wire was cut at 10 cm length. These were evaluated by mean of tensile test for each 10 bonding wire. It is shown as "A" for more than 23 kg/mm$^2$, as "B" for more than 20 kg/mm$^2$ and less than 23 kg/mm$^2$, and as "C" for less than 20 kg/mm$^2$.

Evaluation of "Roundness of squashed ball" was done, as bonding wires, obtained by above-mentioned method, were first bonded to Al electrode (Thickness of Al: around 1 micron) on Silicon chip. Then they were second bonded to leads composed with silver-plated 42-alloy. At that time spans was 3 mm, it was made an arbitrary selection of 50 bonded wires from 200 bonded wires for evaluation. Diameter of squashed ball to parallel direction of ultrasonic energy imposed direction and diameter of squashed ball to vertical direction of it were measured, then the ratio is shown as "A" for range of 0.95-1.05, as "B" for range of 0.90-1.10 (except range of 0.95-1.05), and as "C" for others.

"Synthesized evaluation" was done from above mentioned two evaluations and is shown as "A" for especially excellent result with more than two "A"s, as "B" for excellent result with "A" and without "C", as "C" for ordinarily result except "A and C", as "D" for result with only one "C".

It is obvious from above mentioned results that Au bonding wire alloy of the present invention, if amount of partial additives is within the established range, even in the case of diameter of bonding wire becomes less than 23 μm, the satisfactory result of bonding effect is obtained. Against this fact, it is found that conventional Au bonding wire alloy is out of range about partial additives and in the case of wire diameter is less than 23, satisfactory result of bonding effect is not obtainable.

TABLE 1

| No | Au | Be (mass ppm) | Ca (mass ppm) | La (mass ppm) | Ce (mass ppm) | Eu (mass ppm) | Mg (mass ppm) | Si (mass ppm) | Ga (mass ppm) | Sb (mass ppm) | Sn (mass ppm) | Bi (mass ppm) | Y (mass ppm) |
|---|---|---|---|---|---|---|---|---|---|---|---|---|---|
| 1 | Bal. | 5 | 15 | 5 | | | | | | | | | |
| 2 | Bal. | 5 | 10 | 15 | | | | | | | | | |
| 3 | Bal. | 10 | 10 | 10 | | | | | | | | | |
| 4 | Bal. | 10 | 5 | 20 | | | | | | | | | |
| 5 | Bal. | 15 | 20 | 15 | | | | | | | | | |
| 6 | Bal. | 15 | 5 | 5 | | | | | | | | | |
| 7 | Bal. | 5 | 20 | 5 | 5 | | | | | | | | |
| 8 | Bal. | 10 | 10 | 10 | 10 | | | | | | | | |
| 9 | Bal. | 10 | 10 | 15 | 20 | | | | | | | | |
| 10 | Bal. | 5 | 20 | 5 | | 5 | | | | | | | |
| 11 | Bal. | 10 | 10 | 10 | | 10 | | | | | | | |
| 12 | Bal. | 15 | 5 | 15 | | 20 | | | | | | | |
| 13 | Bal. | 5 | 20 | 10 | | | 5 | | | | | | |
| 14 | Bal. | 10 | 10 | 15 | | | 15 | | | | | | |
| 15 | Bal. | 10 | 15 | 10 | | | | 10 | | | | | |
| 16 | Bal. | 15 | 5 | 20 | | | | 20 | | | | | |

TABLE 1-continued

| No | Au | Be (mass ppm) | Ca (mass ppm) | La (mass ppm) | Ce (mass ppm) | Eu (mass ppm) | Mg (mass ppm) | Si (mass ppm) | Ga (mass ppm) | Sb (mass ppm) | Sn (mass ppm) | Bi (mass ppm) | Y (mass ppm) |
|---|---|---|---|---|---|---|---|---|---|---|---|---|---|
| 17 | Bal. | 5 | 25 | 5 | | | | | 10 | | | | |
| 18 | Bal. | 15 | 10 | 10 | | | | | 15 | | | | |
| 19 | Bal. | 5 | 20 | 10 | | | | | | 20 | | | |
| 20 | Bal. | 10 | 10 | 15 | | | | | | | 50 | | |
| 21 | Bal. | 10 | 15 | 10 | | | | | | | | 50 | |
| 22 | Bal. | 15 | 5 | 20 | | | | | | | | 70 | |
| 23 | Bal. | 5 | 25 | 5 | | | | | | | | 30 | |
| 24 | Bal. | 15 | 10 | 10 | | | | | | | | 50 | |
| 25 | Bal. | 5 | 20 | 10 | | | | | | | | | 5 |
| 26 | Bal. | 10 | 10 | 15 | | 15 | | | | | | | 10 |
| 27 | Bal. | 10 | 15 | 10 | | | 10 | | | | | | 15 |
| 28 | Bal. | 15 | 5 | 20 | | | 20 | | | | | | 10 |
| 29 | Bal. | 5 | 25 | 5 | | | | | 10 | | | | 10 |
| 30 | Bal. | 15 | 10 | 10 | | | | | 15 | | | | 15 |
| 31 | Bal. | 15 | 5 | 5 | 5 | | 5 | | | | | | |
| 32 | Bal. | 10 | 10 | 10 | 10 | | 15 | | | | | | |
| 33 | Bal. | 10 | 25 | 20 | | 15 | 20 | | | | | | |
| 34 | Bal. | 5 | 15 | 15 | 5 | | | 10 | | | | | |
| 35 | Bal. | 10 | 20 | 10 | | 10 | | 10 | | | | | |
| 36 | Bal. | 10 | 25 | 5 | | 5 | 20 | | | | | | |
| 37 | Bal. | 15 | 10 | 10 | 5 | | | | 5 | | | | |
| 38 | Bal. | 5 | 15 | 25 | 15 | | | | 10 | | | | |
| 39 | Bal. | 5 | 20 | 5 | 5 | 10 | | | 15 | | | | |
| 40 | Bal. | 10 | 10 | 20 | 10 | | 5 | 5 | 5 | | | | |
| 41 | Bal. | 10 | 20 | 10 | 15 | | | | | 30 | | | |
| 42 | Bal. | 10 | 10 | 10 | 10 | | | | | 50 | | | |
| 43 | Bal. | 5 | 5 | 15 | | 10 | | | | 70 | | | |
| 44 | Bal. | 10 | 25 | 15 | 5 | | | | | | 30 | | |
| 45 | Bal. | 10 | 10 | 10 | | 10 | | | | | 50 | | |
| 46 | Bal. | 5 | 20 | 5 | 5 | | | | | | 70 | | |
| 47 | Bal. | 10 | 30 | 5 | 5 | | | | | | | 30 | |
| 48 | Bal. | 5 | 10 | 15 | | 10 | | | | | | 50 | |
| 49 | Bal. | 5 | 10 | 10 | 10 | | | | | | | 70 | |
| 50 | Bal. | 10 | 20 | 10 | 10 | | | | | 20 | 20 | 20 | |
| 51 | Bal. | 5 | 10 | 20 | | 10 | 10 | | | | | | 5 |
| 52 | Bal. | 10 | 25 | 10 | 10 | | 15 | | | | | | 10 |
| 53 | Bal. | 5 | 15 | 15 | 15 | | 10 | | | | | | 5 |

TABLE 2

| No. of Table 1 | Diameter of Wire | Roundness | Fracture Stress | Synthesized evaluation |
|---|---|---|---|---|
| 1 | 25 | B | B | C |
| 2 | 25 | A | B | B |
| 3 | 25 | A | A | B |
| 4 | 22 | B | B | C |
| 5 | 22 | B | B | C |
| 6 | 22 | A | B | B |
| 7 | 20 | B | B | C |
| 8 | 20 | A | A | A |
| 9 | 20 | B | A | B |
| 10 | 15 | B | B | C |
| 11 | 15 | B | A | B |
| 12 | 15 | B | B | C |
| 13 | 25 | B | B | C |
| 14 | 25 | A | B | B |
| 15 | 25 | A | A | B |
| 16 | 22 | A | B | B |
| 17 | 22 | B | A | B |
| 18 | 22 | A | B | B |
| 19 | 20 | A | B | B |
| 20 | 20 | A | B | B |
| 21 | 20 | A | B | B |
| 22 | 15 | B | B | C |
| 23 | 15 | B | B | C |
| 24 | 15 | A | B | B |
| 25 | 25 | A | B | B |
| 26 | 25 | A | A | A |
| 27 | 25 | A | A | A |
| 28 | 22 | A | B | B |
| 29 | 22 | B | A | B |
| 30 | 22 | B | B | C |
| 31 | 20 | B | B | C |
| 32 | 20 | A | A | A |
| 33 | 15 | B | A | B |
| 34 | 15 | B | A | B |
| 35 | 15 | A | A | A |
| 36 | 25 | B | B | C |
| 37 | 25 | A | B | B |
| 38 | 25 | B | A | B |
| 39 | 22 | B | B | C |
| 40 | 22 | A | B | B |
| 41 | 22 | B | A | B |
| 42 | 20 | A | A | A |
| 43 | 20 | A | B | B |
| 44 | 20 | B | A | B |
| 45 | 15 | A | A | A |
| 46 | 15 | B | A | B |
| 47 | 15 | B | A | B |
| 48 | 25 | B | B | C |
| 49 | 25 | B | A | B |
| 50 | 25 | B | A | B |
| 51 | 22 | B | A | B |
| 52 | 22 | A | A | A |
| 53 | 22 | B | A | B |

TABLE 3

| No | Au | Be (mass ppm) | Ca (mass ppm) | La (mass ppm) | Ce (mass ppm) | Eu (mass ppm) | Mg (mass ppm) | Si (mass ppm) | Ga (mass ppm) | Sb (mass ppm) | Sn (mass ppm) | Bi (mass ppm) | Y (mass ppm) | Other partial additive elements (mass ppm) |
|---|---|---|---|---|---|---|---|---|---|---|---|---|---|---|
| 1 | Bal. | 3.1 | 2.7 | 11.2 | 9.6 | | | | | | | | | Pr 8.7 and Sm 3.6 |
| 2 | Bal. | 14 | 3 | 5 | 10 | | | | | | | | 3 | Gd 6 |
| 3 | Bal. | 14 | 3 | 5 | 10 | | | | | | | | 3 | Al 6 |
| 4 | Bal. | 16 | 3 | 3 | 3 | | | | | | | | 5 | B 0.08 |
| 5 | Bal. | 8 | 20 | 6 | 5 | | | | | | | | 10 | In 30 |
| 6 | Bal. | 10 | 20 | 20 | 10 | 10 | | | | | 10 | | | Pt 10 and Gd 10 |
| 7 | Bal. | 20 | 10 | 10 | | | | | | | | | | |
| 8 | Bal. | 5 | 50 | 10 | | | | | | | | | | |
| 9 | Bal. | 10 | 10 | 2 | | | | | | | | | | |
| 10 | Bal. | 5 | 10 | 5 | 2 | | | | | | | | | |
| 11 | Bal. | 10 | 30 | 15 | 30 | | | | | | | | | |
| 12 | Bal. | 15 | 5 | 15 | | 30 | | | | | | | | |
| 13 | Bal. | 5 | 15 | 10 | | | 2 | | | | | | | |
| 14 | Bal. | 10 | 20 | 20 | | | 30 | | | | | | | |
| 15 | Bal. | 10 | 5 | 5 | | | | 2 | | | | | | |
| 16 | Bal. | 5 | 15 | 5 | | | | 30 | | | | | | |
| 17 | Bal. | 5 | 25 | 10 | | | | | 2 | | | | | |
| 18 | Bal. | 5 | 10 | 20 | | | | | 30 | | | | | |
| 19 | Bal. | 15 | 30 | 10 | | 15 | | | | 1 | 1 | | | |
| 20 | Bal. | 5 | 5 | 15 | 15 | | | | | 30 | 30 | 30 | | |
| 21 | Bal. | 10 | 20 | 10 | | 10 | | | | | 50 | 50 | | |
| 22 | Bal. | 10 | 30 | 10 | 10 | | | | | | | | 30 | |

TABLE 4

| No. of Example compared | Diameter of Wire μm | Roundness | Fracture Stress | Synthesized evaluation |
|---|---|---|---|---|
| 1 | 20 | B | C | D |
| 2 | 20 | B | C | D |
| 3 | 20 | B | C | D |
| 4 | 15 | C | C | D |
| 5 | 15 | C | B | D |
| 6 | 15 | C | B | D |
| 7 | 22 | B | C | D |
| 8 | 15 | C | A | D |
| 9 | 25 | B | C | D |
| 10 | 20 | C | C | D |
| 11 | 25 | C | A | D |
| 12 | 25 | C | C | D |
| 13 | 25 | C | B | D |
| 14 | 22 | C | B | D |
| 15 | 22 | C | C | D |
| 16 | 22 | C | C | D |
| 17 | 20 | C | B | D |
| 18 | 20 | C | B | D |
| 19 | 20 | C | B | D |
| 20 | 22 | C | C | D |
| 21 | 22 | C | B | D |
| 22 | 22 | C | A | D |

What is claimed is:

1. Au bonding wire for semiconductor device, comprising:
a wire-shaped Au alloy material consisting of:
   3-15 mass ppm of Be,
   3-40 mass ppm of Ca,
   3-20 mass ppm of La,
   3-20 mass ppm of at least one functional element selected from the group of Ce, Eu, Mg, and Si, and
   the remainder of Au,
wherein the diameter of said Au alloy bonding wire is less than 23 microns,
wherein said bonding wire has improved roundness of compressed bonded ball and improved fracture stress.

2. The Au bonding wire for semiconductor device according to claim 1, wherein the at least one functional element is selected from a group of Ce and Eu.

3. The Au bonding wire for semiconductor device according to claim 1, wherein the at least one functional element is selected from a group of Mg and Si.

4. Au bonding wire for semiconductor device, comprising:
a wire-shaped Au alloy material consisting of:
   3-15 mass ppm of Be,
   3-40 mass ppm of Ca,
   3-20 mass ppm of La and said Au alloy including
   3-20 mass ppm of at least one first functional element selected from a group of Mg and Si,
   3-20 mass ppm of at least one second functional element selected from a group of Ce and Eu, and
   the remainder of Au,
wherein said bonding wire has improved roundness of compressed bonded ball and improved fracture stress.

5. Au bonding wire for semiconductor device according to any one of claims 1-3, 4, wherein said Au is consisting of more than 99.99 mass % purity of Au.

6. Au bonding wire for semiconductor device according to any one of claims 2, 3, 4, wherein the roundness of compressed bonded ball of said Au alloy is 0.95-1.05 and fracture stress of said Au alloy bonding wire is more than 23 kg/mm$^2$.

7. The Au bonding wire for semiconductor device according to claim 1, wherein the roundness of compressed bonded ball of said Au alloy is 0.95-1.05 and fracture stress of said Au alloy bonding wire is more than 23 kg/mm$^2$.

* * * * *